United States Patent
Cho et al.

(10) Patent No.: US 6,969,658 B2
(45) Date of Patent: Nov. 29, 2005

(54) METHODS PROVIDING OXIDE LAYERS HAVING REDUCED THICKNESSES AT CENTRAL PORTIONS THEREOF

(75) Inventors: Chang-hyun Cho, Seoul (KR); Min-hee Cho, Kyungki-do (KR); Ki-nam Kim, Kyungki-do (KR)

(73) Assignee: Samsung Electronics Co., Ltd., (KR)

( * ) Notice: Subject to any disclaimer, the term of this patent is extended or adjusted under 35 U.S.C. 154(b) by 80 days.

(21) Appl. No.: 10/173,373

(22) Filed: Jun. 17, 2002

(65) Prior Publication Data

US 2003/0199155 A9  Oct. 23, 2003

(30) Foreign Application Priority Data

Jun. 28, 2001 (KR) ................................ 2001-37634

(51) Int. Cl.[7] .......................................... H01L 21/8234
(52) U.S. Cl. ........................ 438/275; 438/283; 438/195
(58) Field of Search .................................. 438/300, 303, 438/595, 275, 159, 762, 157, 163, 176, 265, 438/790, 791, 279, 195, 301, FOR 177, 283, 438/FOR 193, FOR 205; 257/E21.62, E27.06, 257/395, 401, 365, E21.193, E21.639, E21.645, 257/E21.654

(56) References Cited

U.S. PATENT DOCUMENTS 5,371,026 A * 12/1994 Hayden et al. ............. 438/275
5,512,771 A * 4/1996 Hiroki et al. ............... 257/369
5,858,865 A * 1/1999 Juengling et al. .......... 438/585
6,025,253 A * 2/2000 Sun ............................ 438/585
6,127,248 A  10/2000 Kim .......................... 438/528
6,277,720 B1 * 8/2001 Doshi et al. ............... 438/586
2002/0048920 A1 * 4/2002 Pan ........................... 438/595

FOREIGN PATENT DOCUMENTS

JP          200269458        11/1990

OTHER PUBLICATIONS

Translation of Notice to Submit Response from Korean Patent Office for Korean Application No. 10-2001-0016870 dated May 29, 2003.

* cited by examiner

Primary Examiner—George Fourson
Assistant Examiner—Julio J. Maldonado
(74) Attorney, Agent, or Firm—Myers Bigel Sibley & Sajovec

(57) ABSTRACT

Methods of forming an integrated circuit device may include forming first and second spaced apart source/drain regions on a surface of a semiconductor substrate. A gate insulating layer can be formed on the semiconductor substrate extending between the first and second spaced apart souce/drain regions. The gate insulating layer can have a reduced thickness at a central portion thereof between the first and second spaced apart source/drain regions. A thickness of the gate insulating layer can increase as it extends toward each of the source/drain regions. A gate electrode can be formed on the gate insulating layer such that the gate insulating layer is between the semiconductor substrate and the gate electrode. Related devices are also discussed.

17 Claims, 10 Drawing Sheets

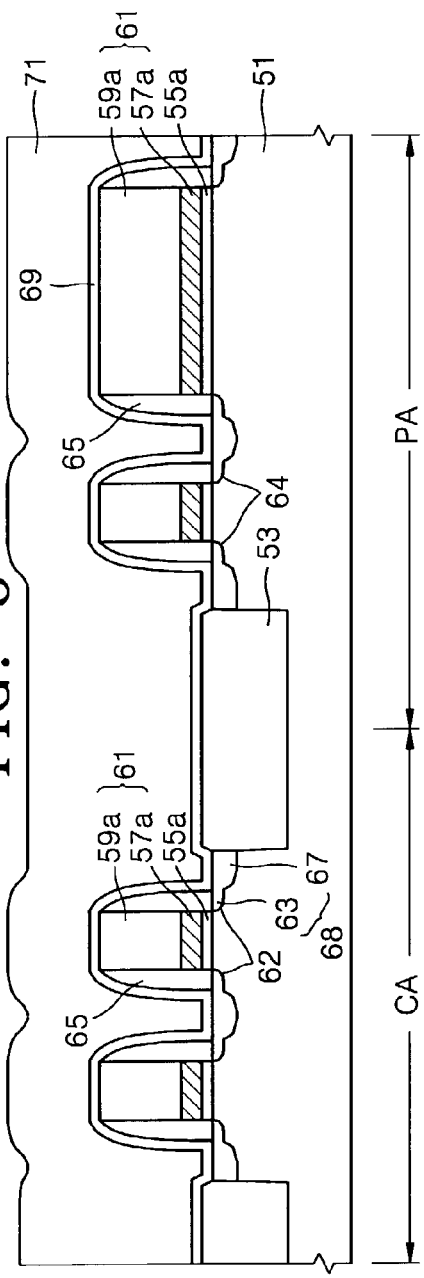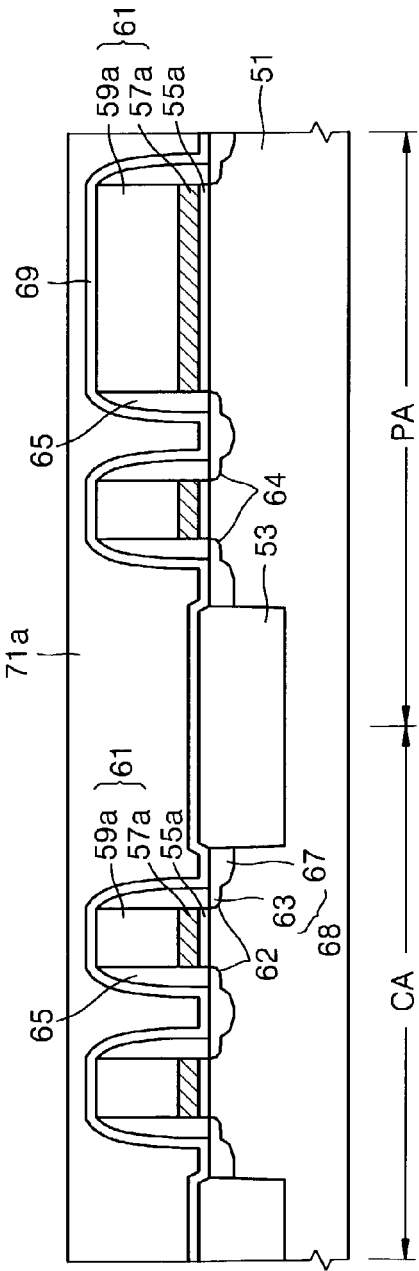

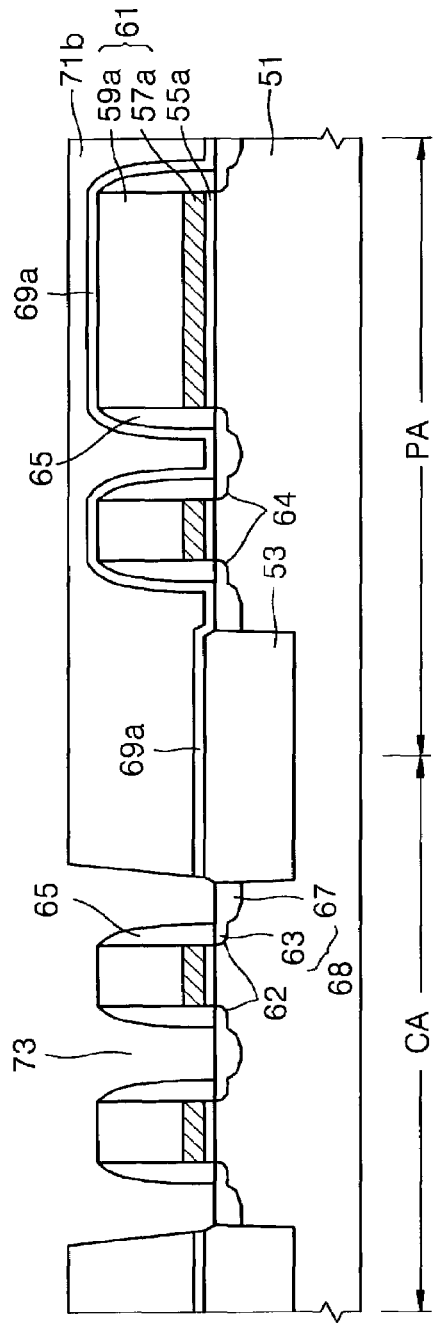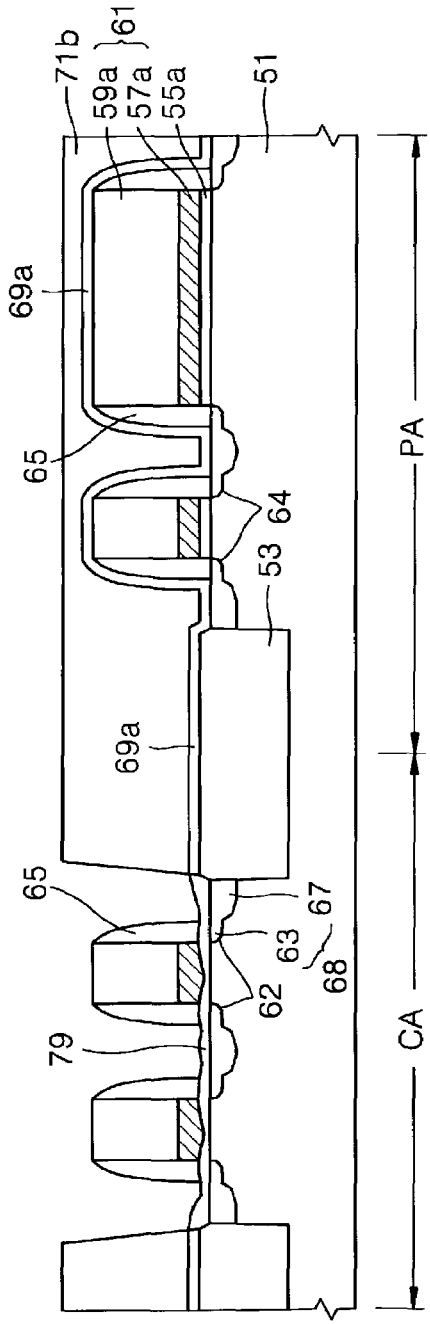

METHODS PROVIDING OXIDE LAYERS HAVING REDUCED THICKNESSES AT CENTRAL PORTIONS THEREOF

RELATED APPLICATION

This application claims the benefit of Korean Patent Application No. 2001-0037634, filed Jun. 28, 2001, the disclosure of which is hereby incorporated herein by reference in its entirety as if set forth fully herein.

BACKGROUND OF THE INVENTION

1. Field of the Invention

The present invention relates to semiconductor devices, and more particularly, to methods of fabricating a integrated circuit devices including gate insulating layers and related devices.

2. Description of the Related Art

High integration of semiconductor memory devices such as DRAM devices has resulted in a reduction in the size of transistors. As the length of a gate decreases, the thickness of a gate insulating layer (such as a gate oxide layer) may be reduced to increase the operational speed of a semiconductor device. However, a decrease in the thickness of the gate insulating layer may also increase a frequency of breakdowns because decreasing the thickness of the gate insulating layer generally results in a lower breakdown voltage. In addition, different areas of a memory device may have varying performance requirements. Therefore, a desired thickness of a gate insulating layer may vary from point to point on a semiconductor device based on desired performance characteristics.

For example, if gate insulating layers in a cell array region and a peripheral circuit region have different thicknesses, it may be possible to improve operational features and reliability of the device. Typically, performance and reliability can be improved if the cell array region has a gate insulating layer with a greater thickness than the peripheral circuit region. More specifically, because of advances in highly integrated semiconductor devices such as DRAM devices, the area of the cell array region of such devices has increased in size compared to the peripheral circuit region. If all of the gate insulating layers formed on a chip have the same thickness, a breakdown may occur first in a gate insulating layer positioned on the cell array region and the semiconductor device may lose reliability or fail to operate at all. This problem may be reduced by increasing thicknesses of the gate insulating layers formed on the cell array region in comparison to gate insulating layers formed on the peripheral circuit region.

FIGS. 1A through 1D are cross-sectional views illustrating a semiconductor device having gate oxide layers of different thicknesses fabricated according to a conventional method. In the structure shown in FIGS. 1A through 1D, the gate oxide layer formed on a left region TK is thicker compared to the gate oxide layer formed on a right region TI. As shown in FIG. 1A, a semiconductor substrate 10, e.g. a silicon substrate, having a trench 11 is first oxidized to obtain a first gate oxide layer 13. The first gate oxide layer 13 may be about 10 nm thick. Next, as shown in FIG. 1B, a photoresist pattern 15 is formed on a portion of the first gate oxide layer 13 in the TK region. A portion of the first gate oxide layer 13 is then etched from the TI region. As a result, the thickness of the first gate oxide layer 13 remaining on the TI region is thinner compared to that on the TK region.

The photoresist pattern 15 is removed from the TK region as shown in FIG. 1C. The first gate oxide layer 13 is etched such that the first gate oxide layer 13 is removed from the TI region. Because the photoresist pattern has been removed, the portion of the first gate oxide layer 13 on the TK region is also etched and the thickness of the gate oxide layer 13 in the TK region is reduced. Next, referring to FIG. 1D, the semiconductor substrate 10 is oxidized again to form a second gate oxide layer 17 on the TI. During this oxidation step, the thickness of the first gate oxide layer 13 on the TK region is increased. Through the above method, the first gate oxide layer 13 on the TK region can have a thickness greater than that of the second gate oxide layer 17 on the TI region. The resulting semiconductor device can thus have gate oxide layers with different thicknesses.

The first gate oxide layer 13 remaining on the TK region may, however, be contaminated when the first gate oxide layer 13 is selectively removed from the TI region (see FIGS. 1B and 1C). This contamination may degrade the operational characteristics of the semiconductor device.

SUMMARY OF THE INVENTION

Methods for forming an integrated circuit device according to embodiments of the invention can include forming a gate insulating layer on the semiconductor substrate extending between first and second spaced apart source/drain regions. The gate insulating layer may have a reduced thickness at a central portion thereof between the first and second spaced apart source/drain regions. Methods may also include forming a gate electrode on the gate insulating layer such that the gate insulating layer is between the semiconductor substrate and the gate electrode. Methods according to additional embodiments may include forming a gate insulating layer having a relatively uniform thickness extending between the first and second spaced apart source/drain regions, and, after forming the gate electrode, increasing a thickness of portions of the gate insulating layer.

Methods according to embodiments of the invention can include forming third and fourth spaced apart source/drain regions on the surface of the semiconductor substrate. A second gate insulating layer can be formed on the semiconductor substrate extending between the third and fourth spaced apart source/drain regions. A second gate electrode can be formed on the second gate insulating layer such that the second gate electrode is between the semiconductor substrate and the second gate electrode. A thickness of portions of the gate insulating layer can then be increased while maintaining a uniform thickness for the second gate insulating layer.

Methods for forming an integrated circuit device according to yet additional embodiments of the invention can include forming first and second spaced apart source/drain region on a surface of a semiconductor substrate, forming a gate insulating layer on the semiconductor substrate extending between the first and second spaced apart source drain regions, and forming a gate electrode on the gate insulating layer such that the gate insulating layer is between the semiconductor substrate and the gate electrode. Methods according to additional embodiments can include increasing a thickness of portions of the gate insulating layer after forming the gate insulating layer and forming the gate electrode on the gate insulating layer. Certain embodiments can include forming third and fourth spaced apart source/drain regions on the surface of the semiconductor substrate. A second gate insulating layer may be formed on the semiconductor substrate extending between the third and fourth spaced apart source/drain regions. A second gate electrode can be formed on the second gate insulating layer such that the second gate insulating layer is between the semiconductor substrate and the second gate electrode. Methods may include increasing a thickness of portions of the gate insulating layer while maintaining a uniform thickness of the second gate insulating layer.

Integrated circuit devices according to embodiments of the present invention may include a semiconductor substrate having first and second spaced apart source/drain regions at a surface thereof. A gate insulating layer on the semiconductor substrate can extend between the first and second spaced apart source/drain regions. The gate insulating layer can have a reduced thickness at a central portion thereof between the first and second spaced apart source/drain regions. A thickness of the gate insulating layer can increase as it extends toward each of the source/drain regions. A gate electrode can be on the gate insulating layer such that the gate insulating layer is between the semiconductor substrate and the gate electrode.

In certain embodiments of the invention, methods for forming an integrated circuit can include forming a gate oxide layer and a gate pattern on a semiconductor substrate having a cell array region and a peripheral circuit region. A source/drain region between separated portions of the gate patterns can be formed near on the surface of the semiconductor substrate. An interlayer insulating film pattern, which fills a gap between separated portions of the gate pattern, can be formed. The interlayer insulating film having a contact hole for exposing the semiconductor substrate may be formed in the cell array region. Finally, a gate oxide layer in the exposed cell array region whose thickness is greater than that of the gate oxide layer formed in the peripheral circuit region may be formed through oxygen diffusion by oxidizing the semiconductor substrate on the exposed cell array region. At this time, the thickness of the gate oxide layer in the cell array region changes depending on the extent of oxidation when the semiconductor substrate is oxidized. Also, the semiconductor substrate in the exposed cell array region may be oxidized through a wet oxidation or dry oxidation method. A contact pad for filling the contact hole may be formed.

BRIEF DESCRIPTION OF THE DRAWINGS

FIGS. 2 through 12 are cross-sectional views illustrating methods of fabricating integrated circuit devices having according to embodiments of the present invention;

DETAILED DESCRIPTION OF THE INVENTION

Figure 1A:
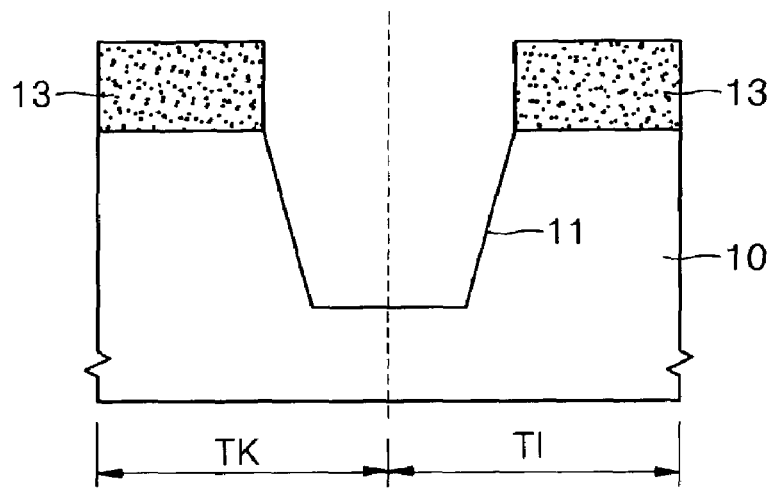
FIGS. 1A through 1D are cross-sectional views illustrating a conventional method of fabricating a semiconductor device having gate oxide layers with different thicknesses.
Figure 1B:
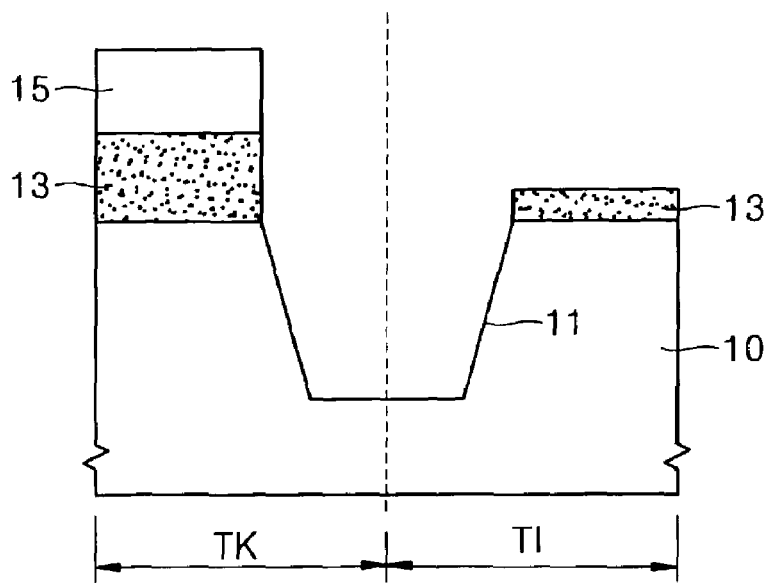
Figure 1C:
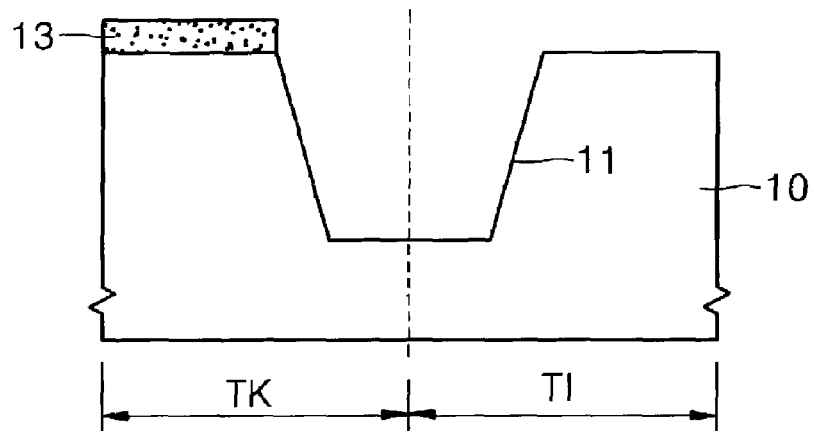
Figure 1D:
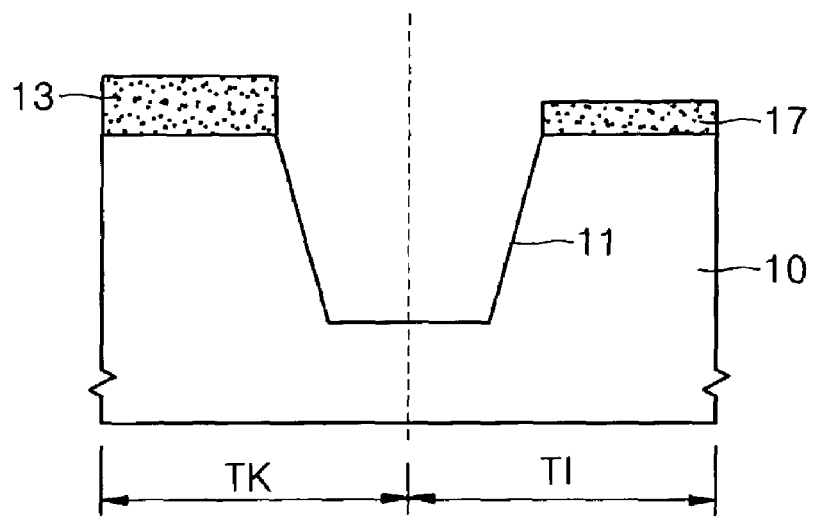

The present invention now will be described more fully hereinafter with reference to the accompanying drawings, in which various embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the relative sizes of elements may be exaggerated for clarity. When a layer is described as being formed on another layer or a semiconductor substrate, the layer may be formed directly on the other layer or semiconductor substrate, or other layers may be interposed therebetween. In contrast, when an element is referred to as being "directly on" another element, there are no intervening elements present. Like reference numerals in the drawings denote like members.

FIGS. 2 through 12 are cross-sectional views illustrating steps of fabricating integrated circuit devices according to embodiments of the present invention. For ease of discussion, the gate insulating layer is described as a silicon oxide layer. Other gate insulating materials known to those of ordinary skill in the art may be used.

Figure 2:
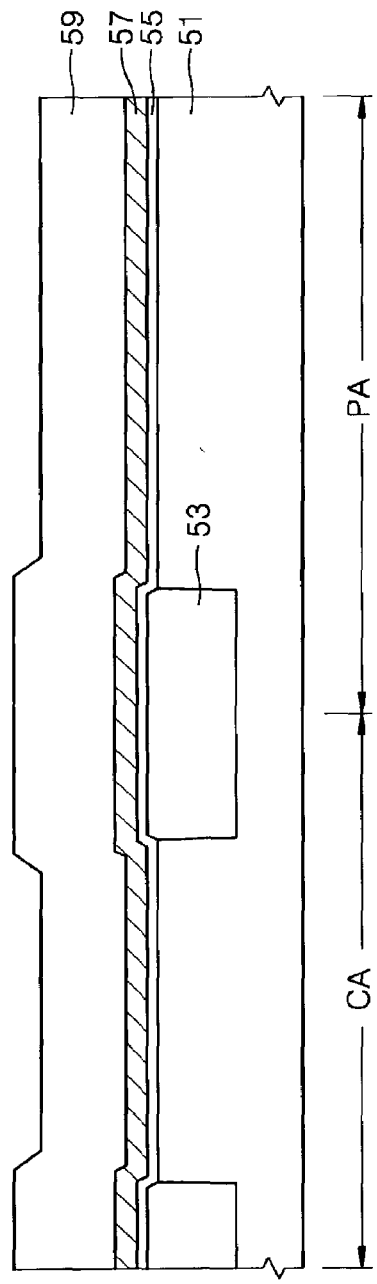

Referring to FIG. 2, a trench oxide layer 53 is formed in a semiconductor substrate 51, e.g., p-type silicon substrate, to define two isolated regions. The isolated regions defined by the trench oxide layer 53 shown in FIG. 2 are a cell array (CA) region and a peripheral circuit (PA) region. A shallow trench isolation (STI) method may be used to form the isolated regions in the present embodiment. Other methods known to those of ordinary skill in the art can be used to isolate the cell array region and the peripheral circuit region. The portion of the semiconductor substrate 51 that includes the trench oxide layer 53 may be an inactive region while remaining portions of the semiconductor substrate 51 may be active regions.

Thereafter, a gate insulating layer such as a gate oxide layer is formed. As shown, a first silicon oxide layer 55 for a gate oxide film can be formed on the entire semiconductor substrate 51. The first silicon oxide layer 55 may be formed after well-ion implantation for forming a well and field-ion implantation and channel-ion implantation for forming a channel. The first silicon oxide layer 55 can be formed of a thermal oxide film. The first silicon oxide layer 55 can be formed such that its thickness is a thickness desired for a gate oxide layer in the PA region. For example, the first silicon oxide layer 55 may have a thickness in a range of about 20 to about 60 Å.

Next, a first conductive layer 57 for a gate electrode is formed on the first silicon oxide layer 55. For example, the first conductive layer 57 include an impurity-doped polysilicon film having a thickness of between about 500 and about 1000 Å and a metal silicide film having a thickness of between about 500 and about 1000 Å. Then, a first insulating film 59 can be formed on the first conductive layer 57. The first insulating film 59 may have a thickness of between about 1000 and about 2000 Å. The first insulating film 59 is preferably formed of a material with etching selectivity with respect to the first silicon oxide layer 55, e.g., a silicon nitride film.

Figure 3:
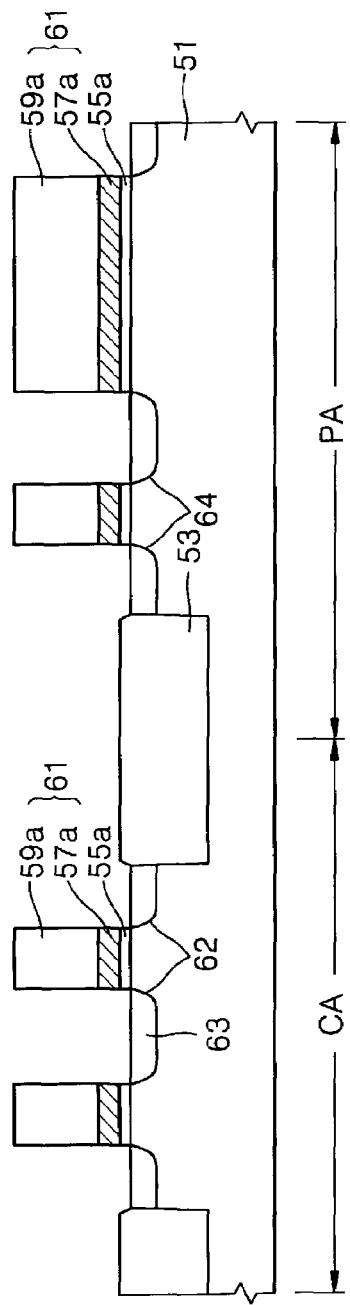

Referring to FIG. 3, the first insulating layer 59, the first conductive layer 57 and the first silicon oxide layer 55 are patterned, for example, through a photolithography process, to form a gate pattern 61 and a gate oxide layer 55a. Gate oxide layer 55a has a substantially uniform thickness. The gate pattern 61 can include a first insulating film pattern 59a and a gate electrode 57a. Thereafter, N-type impurities can be ion-implanted into the entire surface of the semiconductor substrate 51 to form a lightly doped drain (LDD). As a result, a first impurity region 63 can be formed on the surface of the semiconductor substrate 51 while being aligned with respect to the sidewalls of the gate pattern 61. The first impurity region 63 includes first and second spaced apart source/drain regions 62 on the CA region and third and fourth spaced apart source/drain regions 64 on the PA region.

Figure 4:
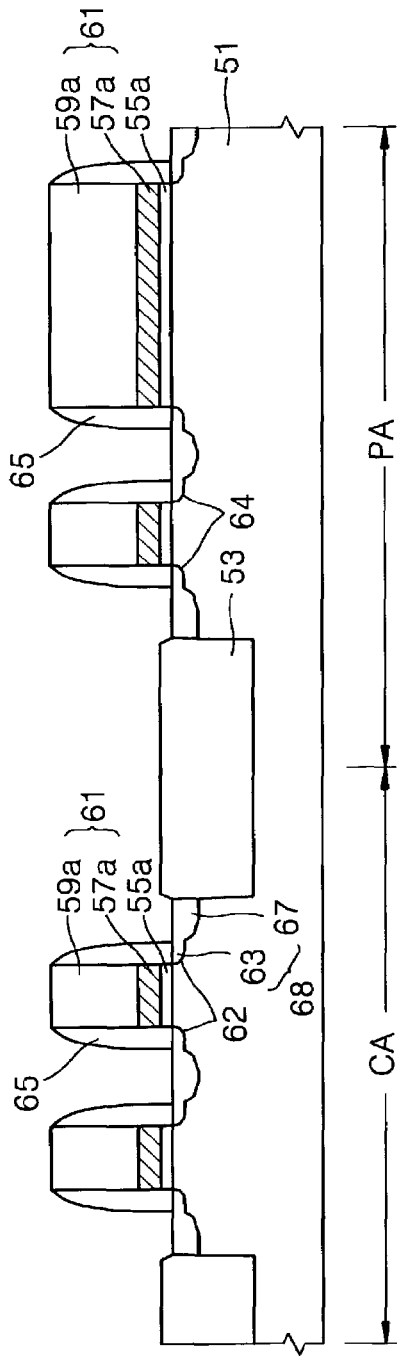

Referring to FIG. 4, a spacer 65 is formed along both sidewalls of the gate pattern 61 and the gate oxide layer 55a. The spacer 65 may be obtained by forming an insulating film of thickness of about 300 Å to about 1000 Å on the entire surface of the semiconductor substrate 51 having the gate pattern 61 and anisotropically etching the insulating film. At this time, the insulating film for the spacer 65 may be formed of a material having high etching selectivity with respect to the silicon oxide layer 55a, e.g., a silicon nitride film.

Next, if necessary, a thermal oxide layer (not shown) may be formed to a thickness of about 50 Å to about 100 Å by thermally oxidizing the semiconductor substrate 51 so that silicon damaged during the anisotropic etching of the insulating film is removed from the semiconductor substrate 51. Further, N-type impurities can be implanted into the entire surface of the semiconductor substrate 51 on which the gate pattern 61 and the spacer 65 are formed. As a result, a second impurity region 67 is formed on the surface of the semiconductor substrate 51 while being aligned with reference to the spacer 65. Finally, an LDD-type source/drain region 68 composed of the first and second impurity regions 63 and 67 can be obtained.

Figure 5:
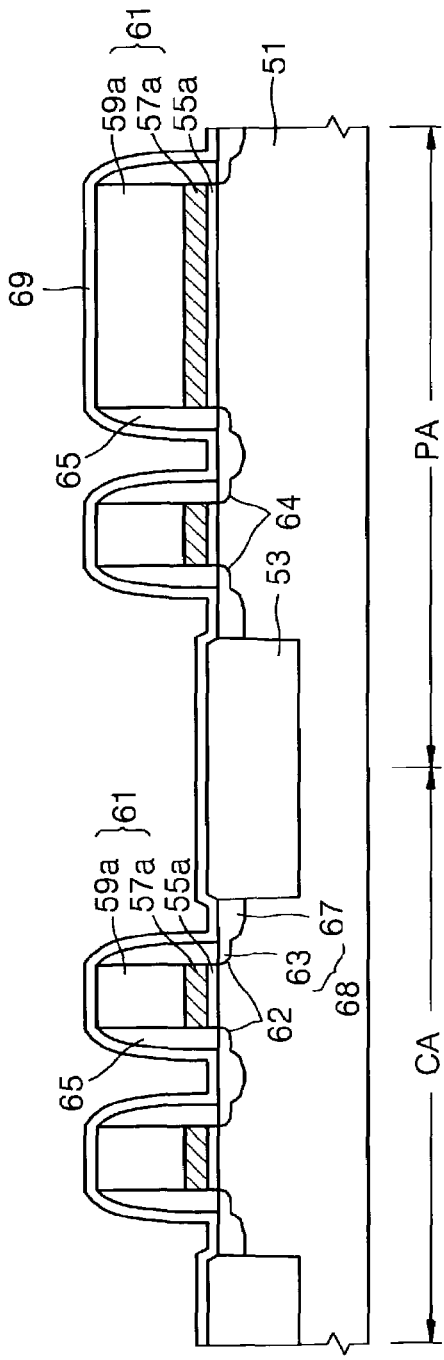

Referring to FIG. 5, a masking film, depicted as second insulating film 69, can be formed on the surface of the semiconductor substrate 51. Any masking material may be used for second insulating film 69. The second insulating film 69 may be formed to a thickness of about 100 Å on the entire surface of the semiconductor substrate 51 having the gate pattern 61 and the gate spacer 65. The second insulating film 69 is preferably formed of a material having high etching selectivity with respect to the silicon oxide layer 55a, e.g., a silicon nitride film.

Referring to FIG. 6, another masking film, such as third insulating layer 71, can be formed on the entire surface of the semiconductor substrate 51 over the second insulating film 69. The third insulating layer 71 may be formed of a silicon oxide film, which preferably has excellent gap fill features for filling narrow and elongated gaps between gate patterns.

Referring to FIG. 7, an interlayer insulating layer 71a can be obtained by planarizing the third insulating film 71, for example, through a chemical mechanical polishing (CMP) method. At this time, the thickness of the interlayer insulating layer 71a may be adjusted within about 0 Å to about 1000 Å from the upper surface of the gate pattern 61.

Figure 13:
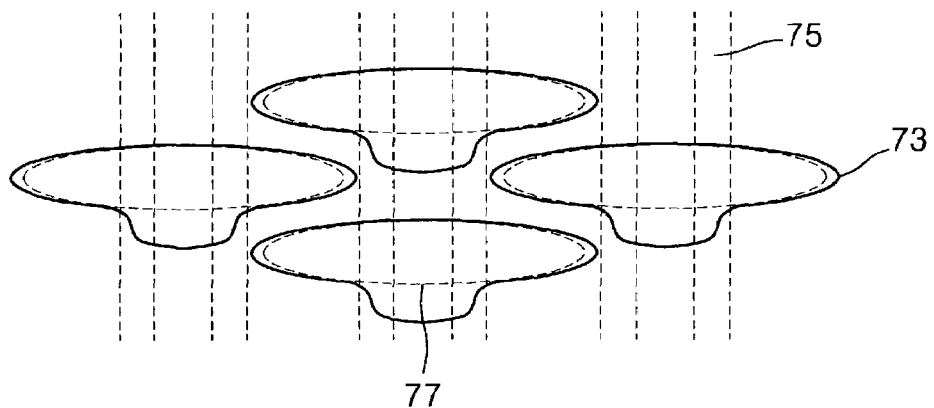
FIG. 13 is a plan view of a structure shown in FIG. 7.

Referring to FIGS. 8 and 13, portions of the interlayer insulating layer 71a and the second insulating layer 69 (shown in FIG. 7) formed on the CA region are removed, for example, by selective etching using a photolithography process. The resulting interlayer insulating layer pattern 71b and second insulating layer pattern 69a provide a masking film pattern to expose the CA region while the interlayer insulating layer pattern 71b and second insulating layer pattern 69a are maintained on the PA region. The area exposed by interlayer insulating layer pattern 71b and second insulating layer pattern 69a in the CA region defines a contact hole 73 to expose the semiconductor substrate 51.

The CA region of the semiconductor substrate 51 is exposed and the PA region is covered by the interlayer insulating layer pattern 71b and second insulating layer pattern 69a for two reasons. First, a contact pad may be formed in contact hole 73 in order that a bit line (or storage node) can easily electrically contact the impurity region on the semiconductor substrate 51 (see FIG. 13). In FIG. 13, the reference numerals 73, 75 and 77 denote a contact hole, a gate line and an active region, respectively. The contact hole 73 may preferably be formed to be larger than the active region 77 by between about 20 to about 40 nm. Second, a thickness of portions of the silicon oxide layer 55a may be increased, as described in greater detail herein, to form gate oxide layer 55b shown in FIG. 10 while a relatively uniform thickness of the gate oxide layer 55a is maintained.

Figure 10:
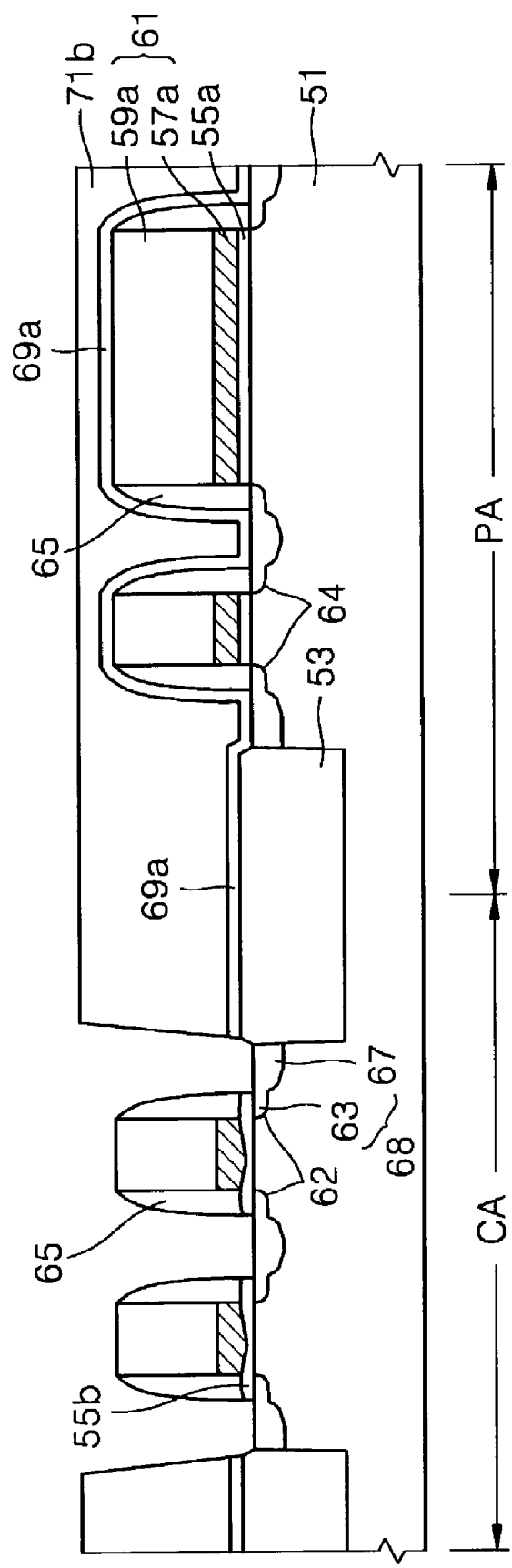
Figure 14A:
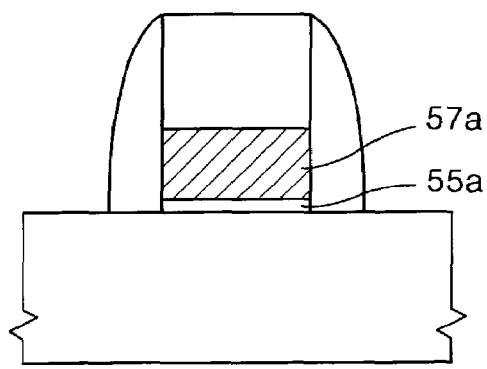
FIGS. 14A and 14B are cross-sectional views illustrating changes in thickness of a gate oxide layer on a cell array region shown.
Figure 14B:
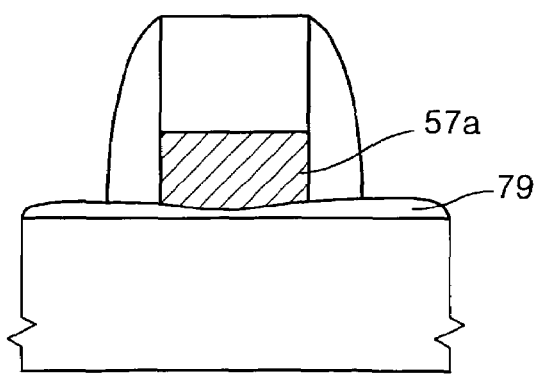

Referring to FIGS. 9, 10, 14A and 14B, the semiconductor substrate 51 including the contact hole 73, which exposes the CA region may be thermally oxidized, for example, through a wet-oxidation or dry-oxidation method as shown in FIG. 9. The PA region is covered by a masking film, which is shown in FIGS. 8 and 9 as the interlayer insulating layer pattern 71b and second insulating layer pattern 69a. A second silicon oxide layer 79 can be formed having a thickness of between about 30 Å and about 100 Å on the CA region of the semiconductor substrate 51. Thus, the gate oxide layer 55a shown in FIG. 14A is oxygen-diffused and changed into the second silicon oxide layer 79. The second silicon oxide layer 79 shown in FIG. 14B has a "bird's beak" shape. That is, the second silicon oxide layer 79 has a reduced thickness at a central portion thereof such that a thickness of the second silicon oxide layer 79 increases as it extends toward each of the first and second source drain regions 62 as shown in FIG. 9. Then, as shown in FIG. 10, the second silicon oxide layer 79 on the CA region is anisotropically etched to form a gate oxide layer 55b of which thickness is different from that of the gate oxide layer 55a formed on the PA region. The thickness of the gate oxide layer 55b on the CA region varies depending on the extent of oxidation of the exposed CA region. As shown in FIG. 10, the edges of the gate oxide layer 55b are thicker than the central portion of the gate oxide layer 55b.

If desired, prior to the anisotropical etching of the second silicon oxide layer 79, impurities may be implanted into the impurity region of the CA region, i.e. the source/drain region 68, so that contact resistance between the source/drain region 68 and a contact pad formed in contact hole 73 is lowered.

Figure 11:
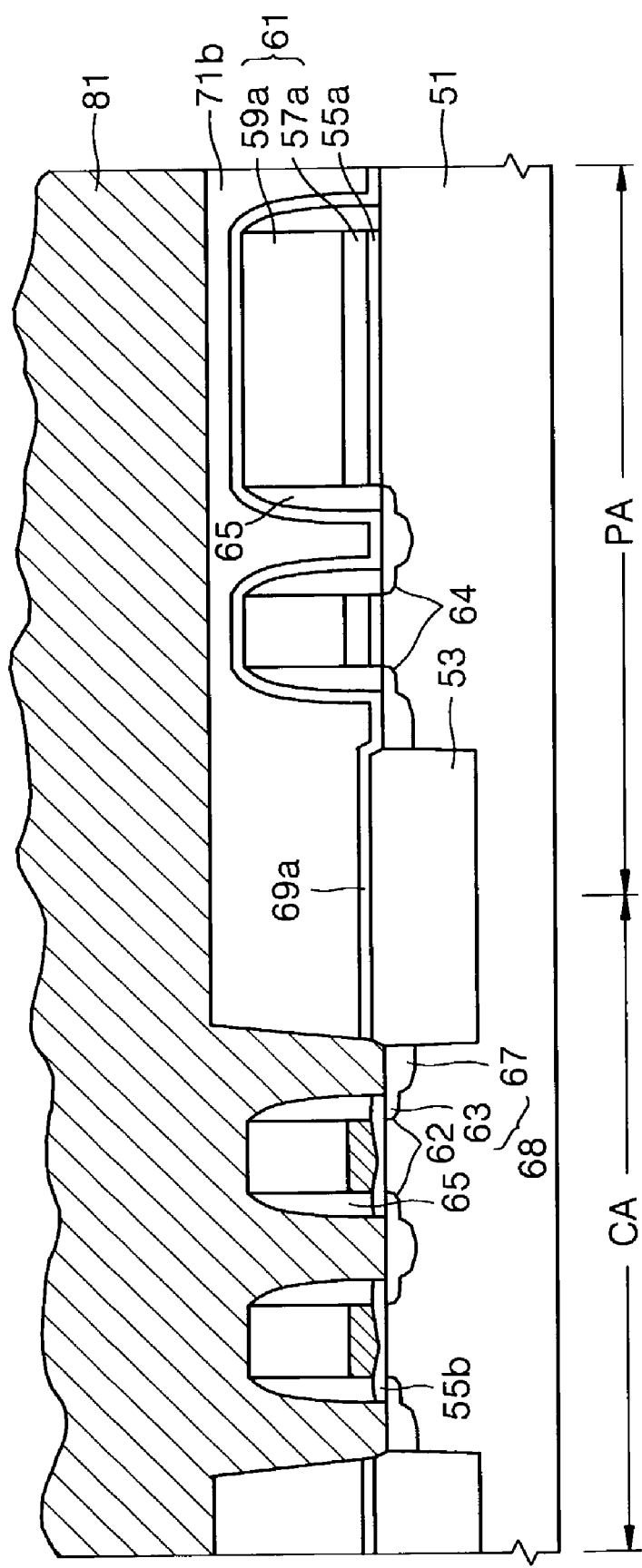

Referring now to FIG. 11, a second conductive layer 81 for a contact pad may be formed to a thickness of between about 3000 Å and about 5000 Å on the entire surface of the semiconductor substrate 51 such that the contact hole 73 (FIG. 8) on the CA region is completely filled. The second conductive layer 81 may be formed using an impurity-doped polysilicon film.

Figure 12:
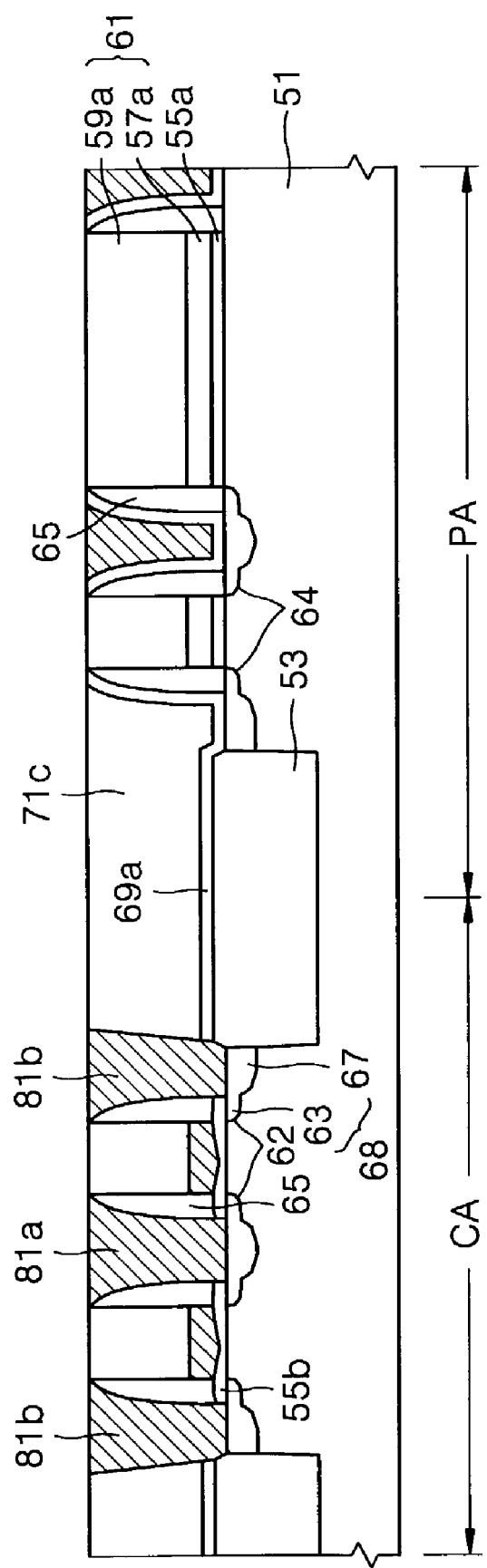

Referring to FIG. 12, the second conductive layer 81 for a contact pad is planarized, for example, through a CMP method thereby forming contact pads 81a and 81b. When the second conductive layer 81 is polished, the upper surface of the gate pattern 61 serves as an etching stopper. Contact pad 81a and contact pads 81b are respectively connected with a bit line and storage nodes of a capacitor in a subsequent process.

The resulting integrated circuit device (FIG. 12) includes a semiconductor substrate 51 having first and second spaced apart source/drain regions 62 on the surface thereof. A gate oxide layer 55b extends between the first and second spaced apart source/drain regions 62. The gate oxide layer 55b has a reduced thickness at a central portion thereof between the first and second spaced apart source/drain regions 62 and a thickness of the gate oxide layer 55b increases as it extends toward each of the source/drain regions 62. The integrated circuit device also includes a gate electrode 57 on the gate oxide layer 55b such that the gate oxide layer 55b is between the semiconductor substrate 51 and the gate electrode. The integrated circuit device may also include a second gate oxide layer 55a on the semiconductor substrate 51 extending between third and fourth spaced apart source/drain regions

64. The second gate oxide layer 55*a* may have a thickness that is relatively uniform across the second gate oxide layer 55*a* between the third and fourth spaced apart source/drain regions. A second gate electrode 57*a* may be situated on the substrate 51 such that the second gate oxide layer 55*a* is between the semiconductor substrate 51 and the second gate electrode 57*a*.

Methods according to embodiments of the present invention can provide integrated circuit devices having gate insulting layers with a central portion having a reduced thickness. Integrated circuit devices according to embodiments of the present invention may be obtained by oxidizing the exposed semiconductor substrate, for example, in the CA region so that the thickness of gate oxide layer on the CA region is increased relative to that of a gate oxide layer formed on the PA region through oxygen diffusion. A gate oxide layer on the CA region may be formed with reduced contamination that may otherwise occur during etching processes, thus enhancing operational characteristics and reliability of the semiconductor device.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method of forming an integrated circuit device, the method comprising:
    forming first and second spaced apart source/drain regions on a surface of a semiconductor substrate;
    forming third and fourth spaced apart source/drain regions on the surface of the semiconductor substrate;
    forming a first gate insulating layer having a relatively uniform thickness on the semiconductor substrate extending between the first and second spaced apart source/drain regions;
    forming a second gate insulating layer on the semiconductor substrate extending between the third and fourth spaced apart source/drain regions;
    forming a first gate electrode on the first gate insulating layer such that the first gate insulating layer is between the semiconductor substrate and the first gate electrode;
    forming a second gate electrode on the second gate insulating layer such that the second gate insulating layer is between the semiconductor substrate and the second gate electrode;
    forming a spacer along a side wall of the first and second gate insulating layers and the first and second gate electrodes;
    providing a masking film on the entire surface of the third and fourth spaced apart source/drain regions while exposing the first and second source/drain regions; and then
    increasing a thickness of portions of the first gate insulating layer while maintaining the masking film and the spacer so that the first gate insulating layer has a reduced thickness at a central portion thereof between the first and second spaced apart source/drain regions and so that a thickness of the first gate insulating layer increases as it extends toward each of the source/drain regions.

2. A method according to claim 1 wherein increasing the thickness of portions of the first gate insulating layer while maintaining the uniform thickness of the second gate insulating layer further comprises oxidizing the first gate insulating layer on the semiconductor substrate extending between the first and second spaced apart source/drain regions.

3. A method according to claim 1 wherein the first and second source/drain regions are LDD type.

4. A method according to claim 1 further comprising:
    after the step of forming first and second spaced apart source/drain regions, forming an insulating film with etching selectivity with respect to the first gate insulating layer on the surface of the semiconductor substrate.

5. A method according to claim 4 wherein the insulating film is a silicon nitride film.

6. A method according to claim 4 further comprising selectively removing portions of the insulating film to expose the first gate insulating layer on the semiconductor substrate extending between the first and second spaced apart source/drain regions while maintaining the insulating layer on the second gate insulating layer and on the third and fourth source/drain regions.

7. A method according to claim 6 further comprising increasing a thickness of the first gate insulating layer on the semiconductor substrate extending between the first and second spaced apart source/drain regions through oxygen diffusion by oxidizing the semiconductor substrate.

8. A method according to claim 7 further comprising:
    forming a contact pad electrically connected to the first and second source/drain regions.

9. A method of forming an integrated circuit device, the method comprising:
    forming first and second spaced apart source/drain regions on a surface of a semiconductor substrate;
    forming a gate insulating layer on the semiconductor substrate extending between the first and second spaced apart source drain regions;
    forming a gate electrode on the gate insulating layer such that the gate insulating layer is between the semiconductor substrate and the gate electrode;
    forming a spacer of a material with etching selectivity with respect to silicon oxide so that the material with etching selectivity with respect to silicon dioxide is directly along a side wall of the gate electrode;
    after forming the gate insulating layer, after forming the gate electrode on the gate insulating layer, and while maintaining the spacer along the side wall of the gate electrode, increasing a thickness of portions of the gate insulating layer between the gate electrode and a region of the substrate between the source/drain regions;
    forming third and fourth spaced apart source/drain regions on the surface of the semiconductor substrate;
    forming a second gate insulating layer on the semiconductor substrate extending between the third and fourth spaced apart source/drain regions; and
    forming a second gate electrode on the second gate insulating layer such that the second gate insulating layer is between the semiconductor substrate and the second gate electrode;
    wherein increasing a thickness of portions of the gate insulating layer is performed while maintaining a uniform thickness of the second gate insulating layer.

10. A method according to claim 9 wherein increasing the thickness of portions of the gate insulating layer while maintaining the uniform thickness of the second gate insulating layer further comprises:

forming a masking film on the third and fourth spaced apart source/drain region wherein the masking film exposes the first and second spaced apart source/drain regions.

11. A method according to claim 9 wherein increasing the thickness of portions of the gate insulating layer further comprises:
    oxidizing the gate insulating layer on the semiconductor substrate extending between the first and second spaced apart source/drain regions after forming the gate electrode.

12. A method according to claim 9 wherein the first and second source/drain regions are LDD type.

13. A method according to claim 9 further comprising:
    after the step of forming first and second spaced apart source/drain regions, forming an insulating film with etching selectivity with respect to the gate insulating layer on the surface of the semiconductor substrate.

14. A method according to claim 13 wherein the insulating film is a silicon nitride film.

15. A method according to claim 13 further comprising selectively removing portions of the insulating film expose the gate insulating layer on the semiconductor substrate extending between the first and second spaced apart source/drain regions while maintaining the insulating layer on the second gate insulating layer and on the third and fourth source/drain regions.

16. A method according to claim 9 wherein increasing a thickness of portions of the gate insulating layer on the semiconductor substrate extending between the first and second spaced apart source/drain regions comprises oxidizing portions of the semiconductor substrate adjacent the gate insulating layer through oxygen diffusion.

17. A method according to claim 9 further comprising forming a contact pad electrically connected to the first and second source/drain regions.

* * * * *